US007633067B2

(12) United States Patent
Ikeda

(10) Patent No.: US 7,633,067 B2
(45) Date of Patent: Dec. 15, 2009

(54) SECURITY SENSOR DEVICE HAVING FROST PROTECTIVE STEP

(75) Inventor: Hiroyuki Ikeda, Otsu (JP)

(73) Assignee: Optex Co., Ltd., Shiga (JP)

( * ) Notice: Subject to any disclaimer, the term of this patent is extended or adjusted under 35 U.S.C. 154(b) by 284 days.

(21) Appl. No.: 11/909,483

(22) PCT Filed: Mar. 29, 2006

(86) PCT No.: PCT/JP2006/306461

§ 371 (c)(1),
(2), (4) Date: Sep. 24, 2007

(87) PCT Pub. No.: WO2006/106732

PCT Pub. Date: Oct. 12, 2006

(65) Prior Publication Data

US 2009/0059483 A1 Mar. 5, 2009

(30) Foreign Application Priority Data

Mar. 30, 2005 (JP) ............................ 2005-096899

(51) Int. Cl.
*H05K 7/00* (2006.01)

(52) U.S. Cl. ................................. 250/353; 361/679.01

(58) Field of Classification Search ................. 250/353; 361/679.01
See application file for complete search history.

(56) References Cited

U.S. PATENT DOCUMENTS 4,282,430 A * 8/1981 Hatten et al. ................ 250/221
4,347,438 A * 8/1982 Spielman .................... 250/221
4,626,683 A * 12/1986 Van Zeeland ............... 250/239
4,650,989 A * 3/1987 Frigon ........................ 250/221
5,812,058 A 9/1998 Sugimoto et al.
6,965,315 B2 * 11/2005 Ikeda ......................... 340/556

FOREIGN PATENT DOCUMENTS

| | | |
|---|---|---|
| JP | 60-134183 U | 9/1985 |
| JP | 61-201191 U | 12/1986 |
| JP | 63-313299 A | 12/1988 |
| JP | 2-122380 U | 10/1990 |
| JP | 4-161831 A | 6/1992 |
| JP | 5-6338 U | 1/1993 |
| JP | 10-39043 A | 2/1998 |

* cited by examiner

*Primary Examiner*—David P Porta
*Assistant Examiner*—Djura Malevic
(74) *Attorney, Agent, or Firm*—Sughrue Mion, PLLC

(57) ABSTRACT

In a security sensor device an element unit (21) including a sensor elements (15, 23) for transmitting or receiving a detection wave (IR) is supported on a sensor body (41) in such a manner as to adjust a horizontal deflecting angle and a vertical deflecting angle θv; a cover (43) is attached to the sensor body; and the center of pivotal movement (10) for the vertical deflection is displaced downward or upward from the intermediate portion of the element unit. A recessed portion (56) recessed inwardly of the cover is formed in a part of the cover corresponding to the part, to which the center of pivotal movement of the element unit is displaced, through a stepped portion (44). A hood (17) for shielding a part of the region, where the detection wave passes for, from the airy region is provided above and near the center of pivotal movement.

4 Claims, 7 Drawing Sheets

2
S
47
41
46
45
42
22
23
55
43
21
36
37
17b
17
44
17a
38
56
35
10
8
9
7
D1
D2
θv

Fig. 6a
Fig. 6b
Fig. 6c
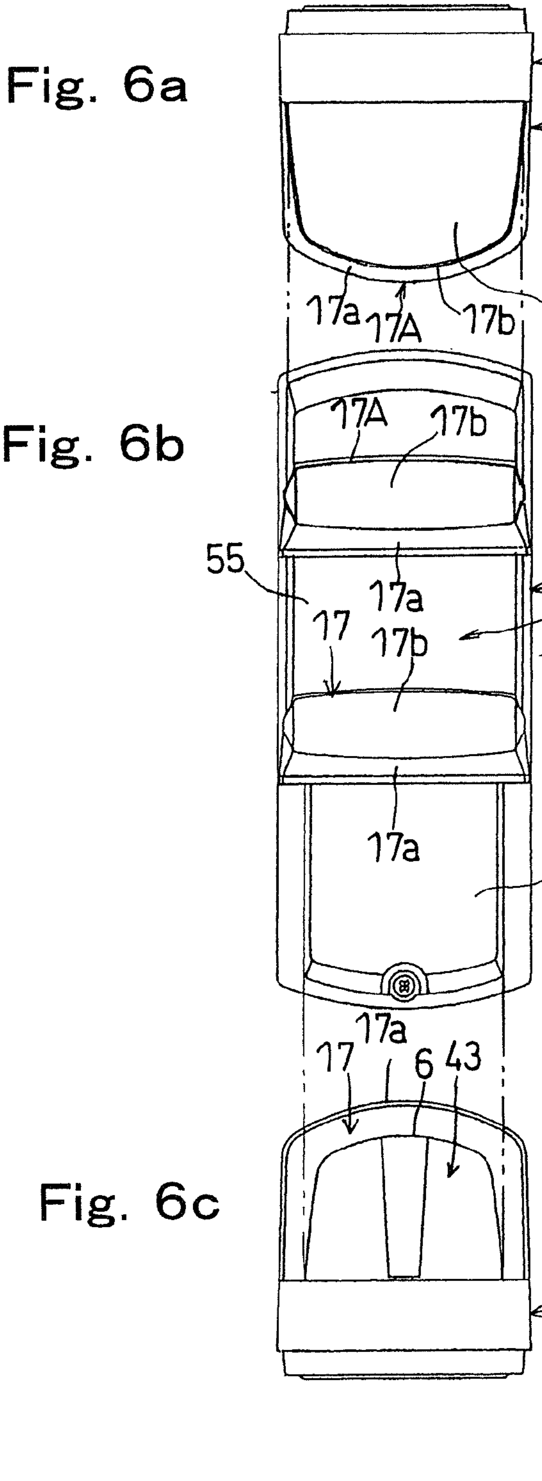
Fig. 6d
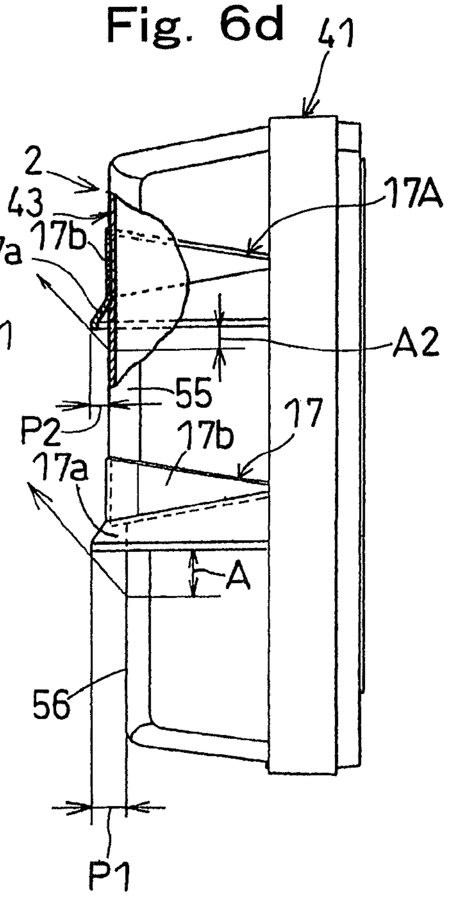

2
S
17b
17
17a
44
22
43A
56
21
55
8
10
23
41
42
46
45
D2
D1

SECURITY SENSOR DEVICE HAVING FROST PROTECTIVE STEP

FIELD OF THE INVENTION

The present invention relates to a security sensor device of a type including a cover provided with a frost protective stepped portion and a frost protective hood fitted to a portion of the cover adjacent the frost protective stepped portion.

BACKGROUND OF THE INVENTION

This type of security sensor device is known, in which an infrared beam transmitter and an infrared beam receiver are arranged at respective opposite ends of a linear alert regions and, while an infrared beam travels from the infrared beam transmitter towards the infrared beam receiver, an entry of a human body into the alert region can be detected once the human body intercepts the infrared beam then traveling from the infrared beam transmitter towards the infrared beam receiver. The infrared beam transmitter and the infrared beam receiver in the security sensor device are of the substantially same appearance with each other (see, for example, the Japanese Laid-open Patent Publication No. H10-039043).

The infrared beam transmitter or receiver such a security sensor device is known, in which a hood or a step is provided to prevent the sky light from impinging upon an optical lens of the beam transmitter and receiver. Accordingly, a portion of a light permeable surface of the cover, through which light is allowed to enter the optical lens, is suppressed from undergoing a radiative cooling as it is shielded from the sky, where a temperature is low, and, therefore, during the winter, a frost is prevented from depositing on the light permeable surface of the cover under the influence of radiative cooling to thereby avoid cutting off the infrared beam by the deposited frost.

SUMMARY OF THE INVENTION

However, in order to enhance such a frost protective effect, it is necessary to employ a hood of a type protruding a substantial distance from the cover or a cover having a large step, and the use of the hood or cover of such size will result in increase of the size of the security sensor device as a whole.

The present invention has been devised with the foregoing problems inherent in the conventional art taken into consideration and is intended to provide a security sensor device having an excellent frost protective effect without incurring any increase in size thereof.

In order to accomplish the foregoing object, the security sensor device of the present invention includes an element unit including a sensor element for transmitting or receiving a detection wave, the element unit being supported by a sensor body for adjustment of a horizontal deflecting angle and a vertical (upward and downward) deflecting angle; a cover mounted on the sensor body for covering the element unit; a center of pivotal movement for vertical deflection in the element unit being set to an eccentric position downwardly or upwardly displaced from a portion of the element unit intermediate in a vertical direction thereof; a recessed portion, which is recessed inwardly of the cover beyond a neighboring portion, formed through a stepped portion in a portion of the cover on one side to which the center of pivotal movement of the element unit is displaced; and a hood provided at a location upwardly of the center of pivotal movement in the cover for shielding at least a portion of an area of passage of a detection wave for the sensor element from an airy region.

According to the foregoing construction, the center of pivotal movement of the element unit is provided eccentrically downwardly or upwardly relative to the point of the element unit intermediate of the vertical direction. Therefore, when the element unit has its horizontal deflecting angle changed within a predetermined angle range while its vertical deflecting angle is maximized, the path of angular movement of the element unit depicts a minimum diameter within a horizontal plane of an outer end on the side to which the center of pivotal movement has been displaced and the path of pivotal movement depicts a maximum diameter within a horizontal plane of the other outer end opposite thereto, resulting in a difference between the respective paths of pivotal movement of the opposite ends of the vertical direction. Accordingly, that portion of the cover on the side to which the center of pivotal movement has been displaced and any other portion can be formed to a shape as small as possible enough to encompass the minimum diameter of the path of pivotal movement and the maximum diameter of the path of pivotal movement of the element unit, respectively, with the step of a size large enough to correspond to the difference between the minimum and maximum diameters of the path of pivotal movement of the element unit.

Accordingly, even though the same hood as that used conventionally is employed, the amount of protrusion of the hood in a direction outwardly from the recessed portion through which the detection wave passes, is greater by a value corresponding to the size of the stepped portion than the conventional sensor device. Hence, the effective frost protective area, which is defined in the recessed portion and which is shielded by the hood from the airy region, can have a vertical width that is so large as to increase the frost protective effect to thereby suppress any possible reduction in amount of passage of the detection wave through the cover. Also, a portion of the cover opposite to the side, to which the center of pivotal movement of the element unit is displaced for the vertical deflection, is required to have a shape greater than the external form of the conventional cover in correspondence with the maximum pivotal path diameter of the element unit. However, since the angle range of vertical deflection of the element unit is small (usually not greater than 10°), it is possible to restrict to the external form slightly larger than the conventional cover. For this reason, there is substantially no possibility of the overall outer form being increased in size.

In the present invention, the hood may be preferably supported on a non-recessed portion of the cover defined above the stepped portion. According to this construction, since the amount of protrusion of the hood as viewed from the detection wave passing area in the recessed portion of the cover represents the sum of the length of protrusion of the hood plus the depth of the stepped portion, it is possible to assuredly set the vertical width of the effective frost protective area, defined in the detection wave passing area of the cover, to a large value.

In the present invention, the detection wave may preferably be an infrared beam, in which case the element unit includes upper and lower optical elements for transmitting or receiving the infrared beam and the hood is operable to accomplish the shielding to one of the optical elements positioned on one side to which the center of pivotal movement is displaced. According to this construction, with respect to at least one of the upper and lower optical elements, an effective frost protective area, at which deposition of a frost is prevented, can be increased to effectively suppress a reduction of the amount of the detection wave passing across the cover.

In such case, an additional hood may be provided in the cover for accomplishing the shielding to the other of the optical elements. In order to suppress an increase in size of the external form of the cover as a whole, it is preferred to reduce the amount of protrusion from the detection wave passing area of the cover to a value smaller than the hood in the cover that is positioned on the side to which the center of pivotal movement of the element unit is displaced. Even though the amount of protrusion is so reduced, a possible reduction of the amount of the detection wave passing through the cover in the other optical element resulting from the deposit of the frost can be suppressed to a certain extent that failure of the sensor element corresponding to the one of the optical elements can be complemented.

BRIEF DESCRIPTION OF THE DRAWINGS

In any event, the present invention will become more clearly understood from the following description of preferred embodiments thereof, when taken in conjunction with the accompanying drawings. However, the embodiments and the drawings are given only for the purpose of illustration and explanation, and are not to be taken as limiting the scope of the present invention in any way whatsoever, which scope is to be determined by the appended claims. In the accompanying drawings, like reference numerals are used to denote like parts throughout the several views, and:

FIGS. 6*a* to 6*d* are a top plan view, a front elevational view, a bottom view and a right side view, respectively, showing the beam receiver of a modified form of the security sensor device according to the first preferred embodiment of the present invention;

DESCRIPTION OF THE PREFERRED EMBODIMENT

Hereinafter, preferred embodiments of the present invention will be described with particular reference to the accompanying drawings.

Figure 1:
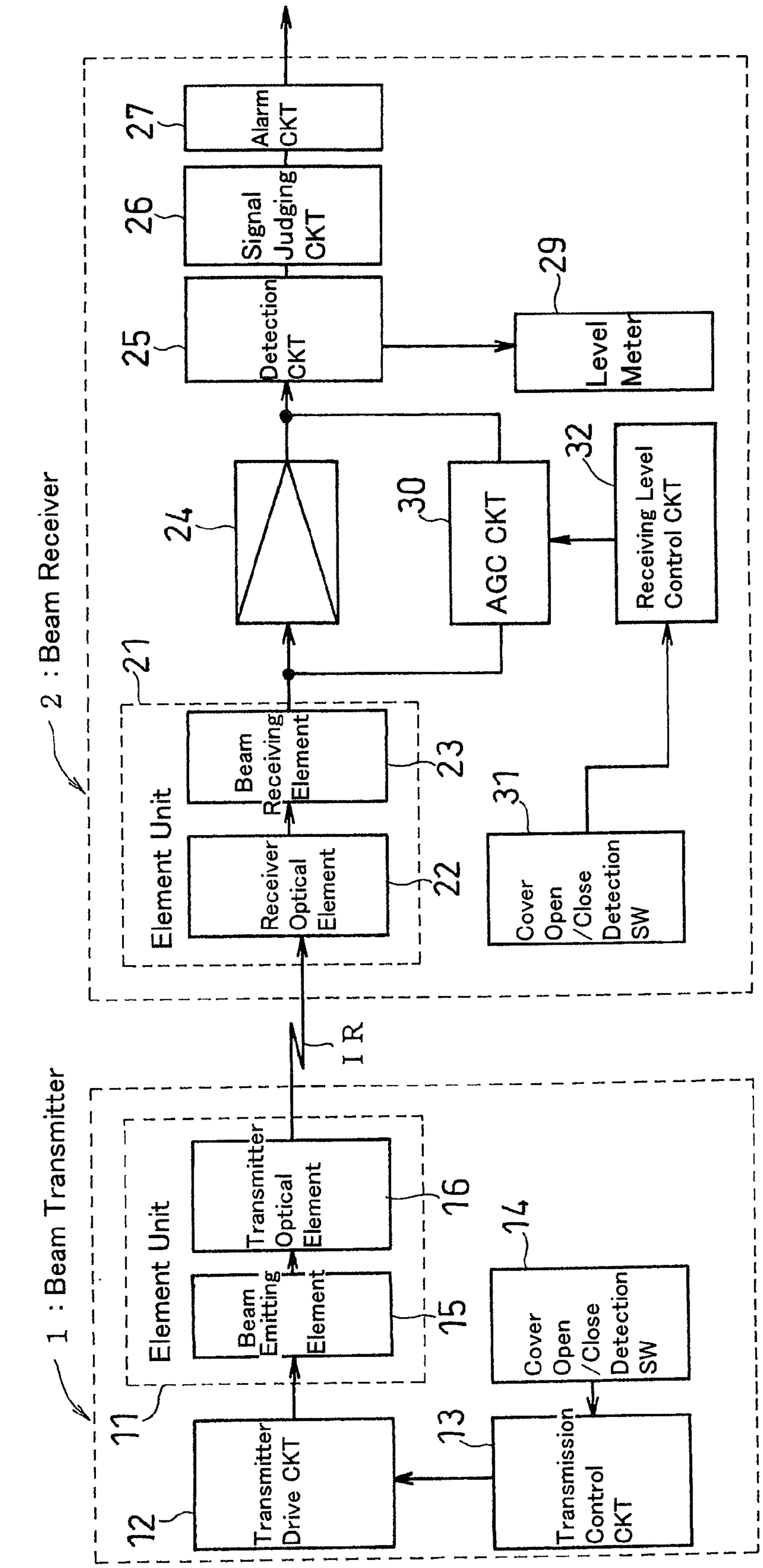
FIG. 1 is a circuit block diagram showing a security sensor device according to a first preferred embodiment of the present invention.

FIG. 1 is a circuit block diagram showing a security sensor device according to a first preferred embodiment of the present invention.

The security sensor device shown therein is an infrared detecting device of an active type including a beam transmitter 1 and a beam receiver 2 mounted respectively on wall surfaces or poles at opposite ends of a linear alert region in optically aligned relation with each other, and is capable of transmitting and receiving an infrared beam IR as a detection wave for detecting a human body. When the beam receiver 2 detects the infrared beam transmitted from the beam transmitter 1, but intercepted by a human body, the presence of the human body can be detected. The beam transmitter 1 and the beam receiver 2 are of a structure unitized together as will be described later.

The beam transmitter 1 includes a transmitting side element unit 11, a transmitter drive circuit 12, a transmission control circuit 13, and a transmitting side cover open/close detection switch 14. Each of the element unit 11, the transmitter drive circuit 12 and the transmission control circuit 13 is provided in a plural number, for example, in a pair, but only one is shown in FIG. 1. The element unit 11 includes a beam emitting element 15 such as, for example, an infrared light emitting diode and a transmitter optical element 16 such as, for example, a beam transmitting lens or a reflective mirror for forming an infrared beam IR such as, for example, a near infrared beam. The element unit 11 operates as a beam transmitter. The transmitter drive circuit 12 is operable to drive the beam emitting element 15 at a predetermined frequency to cause the beam emitting element 15 to emit the infrared beam IR made up of pulse modulated waves. The transmitting side cover open/close detection switch 14 is a contact type or proximity type switch for detecting selective opening or closure of the cover relative to the sensor body as will be described later. The transmission control circuit 13 is operable, when the cover open/close detection switch 14 detects the opening of the cover, to control the transmitter drive circuit 12 so that an electric drive power reduced by an amount corresponding to the quantity of the infrared beam from the beam emitting element 15, which is transmitted having been attenuated by the cover, can be supplied to the beam emitting element 15.

On the other hand, in the beam receiver 2, the receiving side element unit 21 includes a receiver optical element 22 such as, for example, a beam receiving lens or a beam collecting mirror and a beam receiving element 23 such as, for example, a phototransistor. The receiving side element unit 21 operates as a beam receiver. This receiving side element unit 21 is operable to receive the infrared beam IR from the beam transmitter section 1 and to output an electric signal proportional to the amount of the infrared beam received thereby. This electrical signal is, after having been amplified by an amplifying circuit 24, supplied to a detection circuit 25, by which an external disturbance light is removed and the electrical signal is converted into a signal proportional to the level of the received beam signal and in the form of only a pulse modulated wave. This signal outputted from the detection circuit 25 is then supplied to a signal judging circuit 26, where a decision is made to determine if this signal level is lower than a predetermined detection level. In the event that the level of the received beam signal is lower than a predetermined detection level as a result of the infrared beam IR from the beam transmitter 1 having been intercepted by an unauthorized intruder, the signal judging circuit 26 outputs a detection signal to an alarm circuit 27 to trigger the latter to provide, for example, a security center (not shown) with a warning signal indicative of the presence of the unauthorized intruder.

Also, the signal level proportional to the amount of the infrared beam received by the element unit 21 is displayed by a level meter 29 such as, for example, a voltmeter electrically connected with the detection circuit 25. In addition, the amplifier 24 has its gain controlled by an AGC circuit 30 in accordance with the signal level of the received beam signal fed from the element unit 21 so that the output from the amplifier 24 can be lower than a certain signal level at all times. Although each of the element unit 21, the amplifier 24, the detection circuit 25, the signal judging circuit 26 and the level meter 29 is also provided in a plural number, for example, in a pair, only one thereof is shown in FIG. 1. The beam receiver 2 also includes a receiving side cover open/close detection switch 31 and a receiving level control circuit 32. The receiving side cover open/close detection switch 31 is a contact type or proximity type switch for detecting selective opening or closure of the cover, as will be described later, relative to the sensor body. The receiving level control circuit 32, when the cover open/close detection switch 31 detects the opening of the cover, lowers the gain of the amplifier circuit 24 through the AGC circuit 30 so that the amplifier circuit 24 can be controlled to amplify the signal level of the received beam signal from the element unit 21 by reducing such signal level by a quantity corresponding to the quantity attenuated by the cover.

Figures 2A, 2B, 2C:
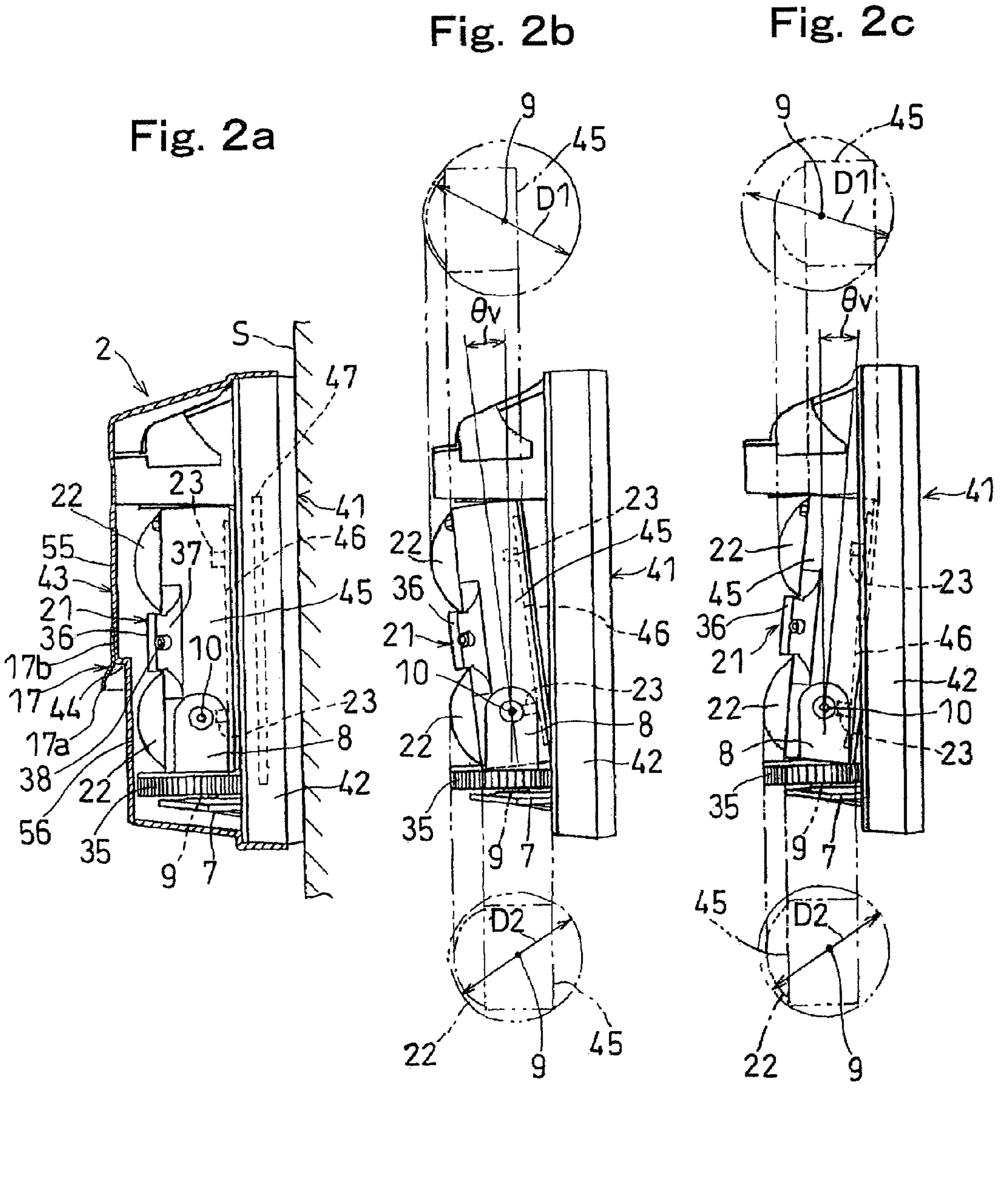
FIG. 2*a* is a right side view of the security sensor device with a portion of a beam receiver cut out.
FIGS. 2*b* and 2*c* are right side views of the beam receiver with a cover removed, showing an element unit held at different angles of vertical deflection relative to a sensor body, respectively.

Each of the beam transmitter 1 and the beam receiver 2, both referred to above, is unitized to represent the same outer shape. Accordingly, only the beam receiver 2 shown in FIGS. 2*a* to 2*c* will be described in detail as a representative example. This beam receiver 2 includes a sensor body 41 and a cover 43. The sensor body 41 is made of a resinous material and mounted on a support surface S such as, for example, a wall surface or a pole as shown in FIG. 2*a*, and the cover 43 is also made of a resinous material and removably capped onto a base 42 of the sensor body 41.

The receiving side element unit 21 includes upper and lower receiver optical elements 22 each comprised of a beam receiving lens and retained by a unit casing 45, a first circuit substrate 46 mounted inside the unit casing 45, and upper and lower beam receiving elements 23 surface mounted on the first circuit substrate 46 at respective locations rearwardly of the associated receiver optical elements 22. A second circuit substrate 47 mounted on the base 42 has the sensor circuits 21, 24 to 27 and 29 to 32 of respective structures shown in FIG. 1 surface mounted thereon.

Figure 3:
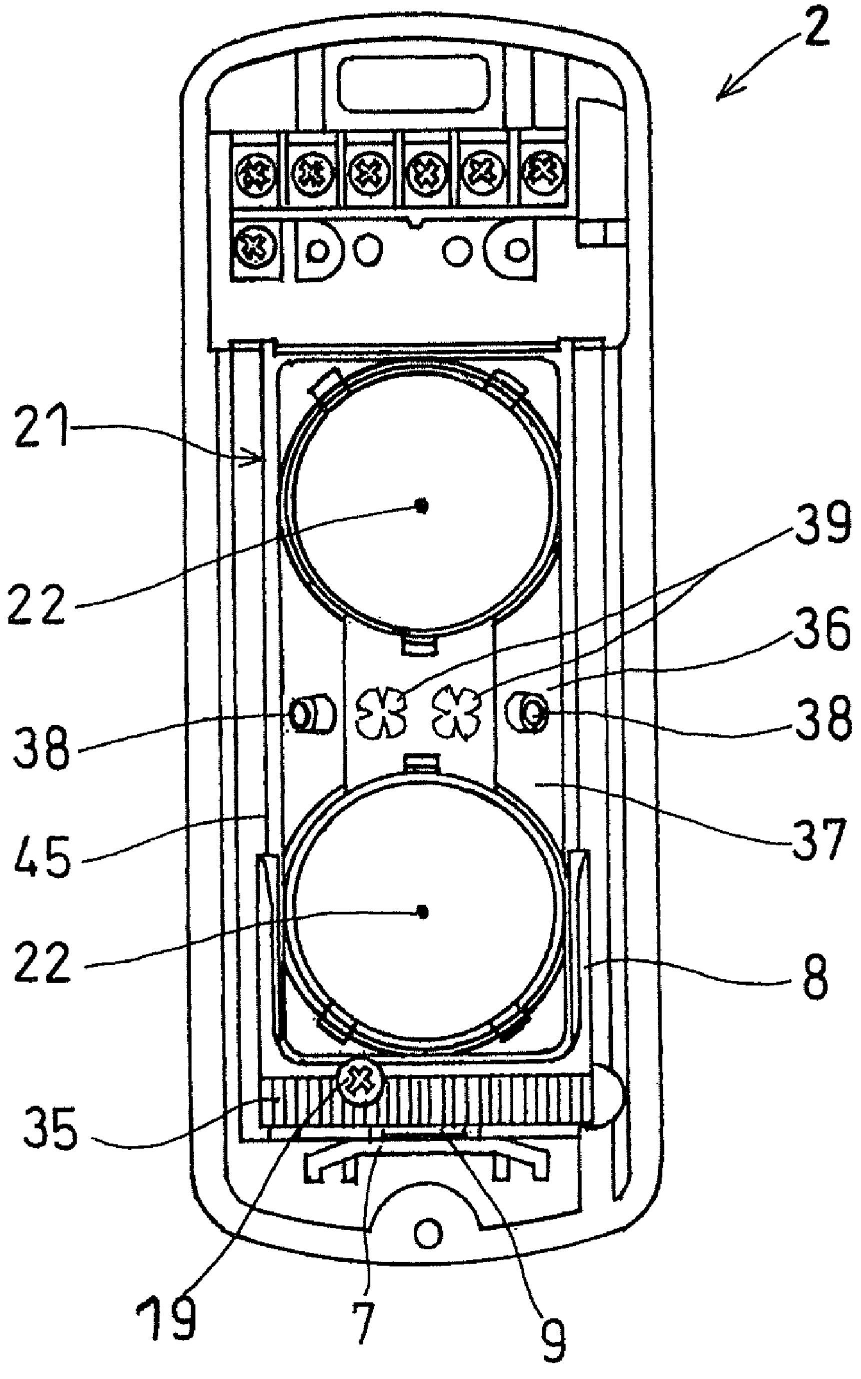
FIG. 3 is a front elevational view, showing the beam receiver with a cover removed.

A support member 7 secured to a front lower portion of the base 42 has, as shown in a front elevational view in FIG. 3, a U-shaped holder 8 supported thereby in a cantilever fashion for angular movement about a vertically extending stationary pivot pin 9. The element unit 21 is mounted on this holder 8 for angular movement about a pair of horizontally extending transverse stationary pivot pins 10 as shown in FIG. 2*a*. The vertically extending pivot pin 9 may be, for example, a screw member (FIG. 4) and each of the transverse pivot pins 10 is a cylindrical pin. Accordingly, the element unit 21 has its horizontally deflecting angle adjusted when pivoted about the vertically extending pin 9 together with the holder 8 relative to the base 42, and also has a vertically deflecting angle adjusted when pivoted about the transverse pins 10 relative to the holder 8. Accordingly, with the element unit 21 so pivoted, an optical alignment with the element unit 21 can be accomplished. This optical alignment is performed by the aid of a sighting instrument 36 as will be described later.

In the element unit 21 referred to above, the vertically extending pivot pin 9, which defines the center of pivotal movement about which the unit casing 45 shown in FIG. 3 undergoes a horizontal deflection, is disposed at a portion of the holder 8 intermediate of a leftward and rightward direction (a horizontal direction). However, the transverse pins 10 best shown in FIG. 2*a* for defining the center of pivotal movement about which the unit casing 45 undergoes a vertical deflection, are disposed at a location displaced downwardly relative to a portion of the unit casing 45 intermediate of an upward and downward direction (a vertical direction). The conventional transverse pivot pins 10 have been disposed at a portion of the unit casing 45 intermediate of an upward and downward direction (a vertical direction).

Figure 4:
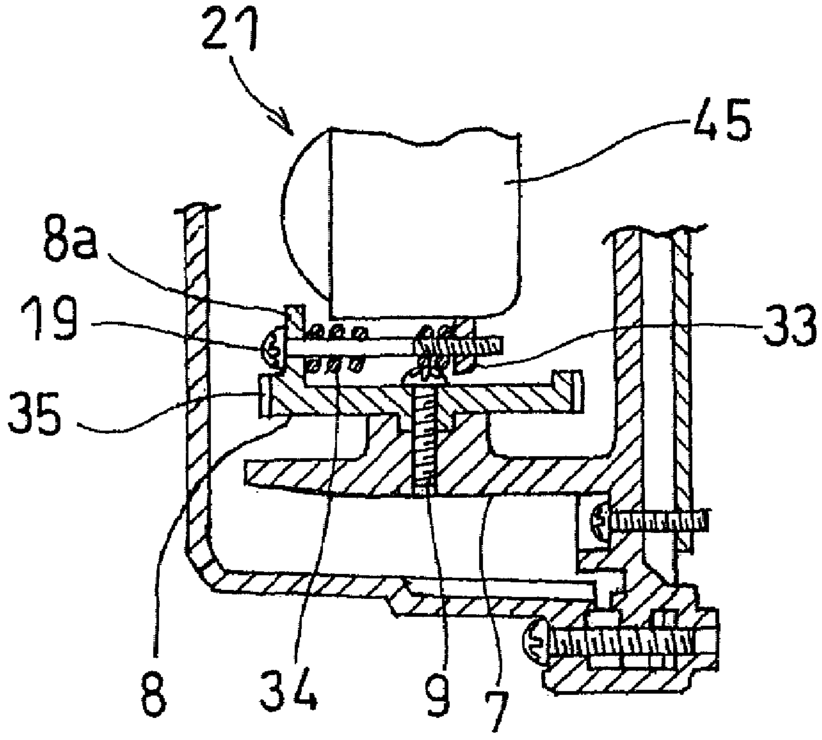
FIG. 4 is a longitudinal sectional view of an essential portion of the beam receiver.

The holder 8 referred to previously is formed integrally with a dial 35 for turning the holder 8 about the vertically extending pivot pin 9 in order to adjust the horizontal deflecting angle of the element unit 21. Also, as shown in FIG. 4, a vertical front wall 8*a* is integrally formed with the holder 8, and a vertical projection 33 is formed with a rear end portion of the unit casing 45 so as to protrude downwardly. An adjustment screw 19 is rotatably passed through the front wall 8*a* and is threadingly engaged in the projection 33. A coiled spring body 34 for urging the projection 33 and, hence, the unit casing 45 in a direction rearwardly (in a rightward direction as view in FIG. 4) is interposed between the projection 33 and the front wall 8*a*. Accordingly, when the dial 35 is turned, the horizontal deflecting angle of the element unit 21 can be adjusted together with the holder 8 and, when the adjustment screw 19 is turned, the vertical deflecting angle of the element unit 21 can be adjusted.

The sighting instrument 36 of any known construction for aiding the optical alignment is provided at a vertically intermediate portion of the unit casing 45 of the element unit 21, shown in FIG. 3. This sighting instrument 36 has a sighting instrument casing 37, left and right viewing windows 38 defined in the sighting instrument casing 37, left and right sighting holes 39 defined in left and right portions of a front forward surface, and left and right reflecting mirrors (not shown) disposed inside the sighting instrument casing 37. Looking through one of the viewing windows 38 of this sighting instrument 36 while the cover 43 is opened, an attendant worker manually turns the dial 35 or the adjustment screw 19 to adjust the horizontal deflecting angle or the vertical deflecting angle. When an image of the element unit 11 of the beam transmitter 1, shown in FIG. 1, which is projected onto one of the reflecting mirrors may overlap the sighting hole 39 shown in FIG. 3, a rough optical alignment can be accomplished. Following this rough optical alignment, a fine adjustment of the optical axis is carried out by adjusting the dial 35 and the adjustment screw 19, both shown in FIG. 3, to such an extent that a display of the level meter 29 (FIG. 1), then viewed by the attendant worker, attains a maximum value. Until the display of the level meter 29 shown in FIG. 1 attains a value higher than a predetermined level, that is, the optical axis of the beam receiver 2 accurately align with the beam transmitter 1, the optical adjustment of the beam transmitter 1 and the beam receiver 2 is repeated a plurality of times if so required. It is to be noted that the beam transmitter 1 is of a structure substantially identical with that of the beam receiver 2.

On the other hand, in the cover 43 shown in FIG. 2*a*, a stepped portion 44 is formed at a portion thereof confronting the vertically intermediate portion of the element unit 21, and a non-recessed portion 55 and a recessed portion 56 are formed above and below the stepped portion 44, respectively. In other words, at a portion corresponding to a downward side to which the transverse pivot pins 10, defining the center of pivotal movement of the element unit 21 for the vertical deflection, are offset relative to the vertically intermediate portion of the element unit 21, the recessed portion 56, depressed from the other non-recessed portion 55 in a direction inwardly of the cover 43, is formed through the stepped portion 44. Also, the cover 43 is provided with a hood 17, which is engaged in, and bonded with a bonding material to an outer peripheral surface of the non-recessed portion 55 at a location adjacent the stepped portion 44 in the non-recessed portion 55 on one side above the stepped portion 44. In order to prevent the infrared beam IR from being blocked as a result of frosting of a beam transmissive surface (an area through which the infrared beam IR, which is a detection wave, passes) of the cover 43, which takes place during the winter by the effect of the radiative cooling, in which heat is radiated from the surface of the cover 43 towards the airy region where the temperature is low, the stepped portion 44 and the hood 17 cooperate with each other to suppress the radiative cooling by shielding a portion of the light transmissive surface of the cover 43 from the airy region.

Although the element unit 21 referred to above is shown to include upper and lower optical elements 22, 22 and upper and lower beam receiver elements 23, 23, there would be no problem in terms of the function to detect a human body, if the amount of the infrared beam IR passing through the cover is secured to a required value with respect to at least one of the optical elements 22, 22 and corresponding one of the beam receiving elements 23, 23. In other words, it is sufficient to prevent the blocking of the infrared beam IR, which will result from deposition of a frost on a portion of the beam transmissive surface of the cover 43, which corresponds to at least one of the two optical elements 22, 22. In view of this, in the illustrated embodiment, a frost protective means made up of the stepped portion 44 and the hood 17 is provided only to the lower optical element 22, and the details of this frost protective means will be described later.

The variable range of the horizontal deflecting angle of the beam receiver 2 about the center of pivotal movement defined by the vertically extending pivot pin 9 is set to 180° and the variable range of the vertical deflecting angle θv of the beam receiver 2 about the center of pivotal movement defined by the transverse pivot pins 10 shown in FIGS. 2B and 2C is set to 5° or smaller. FIG. 2*b* illustrates a condition, in which the element unit 21 is pivoted in a downwardly oriented direction to a position at which the vertical deflecting angle θv is maximal, but FIG. 2*c* illustrates a different condition, in which the element unit 21 is pivoted in an upwardly oriented direction to a position at which the vertical deflecting angle θv is maximal. Even where the horizontal deflecting angle is changed to 180° during the condition shown in either FIG. 2*b* or FIG. 2*c*, the path of angular movement of an upper end contour of the unit casing 45 about the vertically extending pin 9 and the path of angular movement of a lower end contour of the unit casing 45 about the vertically extending pin 9 depict respective diameters that are different from each other because the transverse pins 10, defining the center of pivotal movement for the vertical deflection angle θv, are displaced downwards. In other words, in the event that the horizontal deflecting angle is changed to 180° while the element unit 21 is held in the condition referred to above, the diameter depicted by the path of pivotal movement of the upper end contour of the unit casing 45 represents the maximum diameter D1 of the path of pivotal movement of the element unit 21 and, on the other hand, the diameter depicted by the path of pivotal movement of the lower end contour of the unit casing 45 represents the minimum diameter D2 of the path of pivotal movement of the element unit 21.

The maximum pivotal path diameter D1 depicted by the path of pivotal movement of the upper end contour of the unit casing 45 is greater than that in the conventional case, in which the transverse pivot pins 10, defining the center of pivotal movement for the vertical deflecting angle, are set to a portion intermediate of the vertical direction of the element unit 21. However, since the variable range of the vertical deflecting angle θv is equal to or smaller than 5°, it merely increases to a value slightly greater than the diameter of the conventional path of pivotal movement. On the other hand, the minimum pivotal path diameter D2 depicted by the path of pivotal movement of the lower end contour of the unit casing 45 becomes smaller than the diameter, depicted by the conventional path of pivotal movement, by a quantity corresponding to the distance that the transverse pivot pins 10, defining the center of pivotal movement for the vertical deflecting angle θv, have been offset downwardly from the portion intermediate of the vertical direction of the unit casing 45.

Figure 5A:
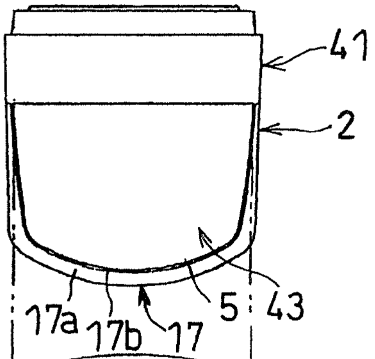
FIG. 5*a* is a top plan view of a beam receiver of the security sensor device.
Figure 5B:
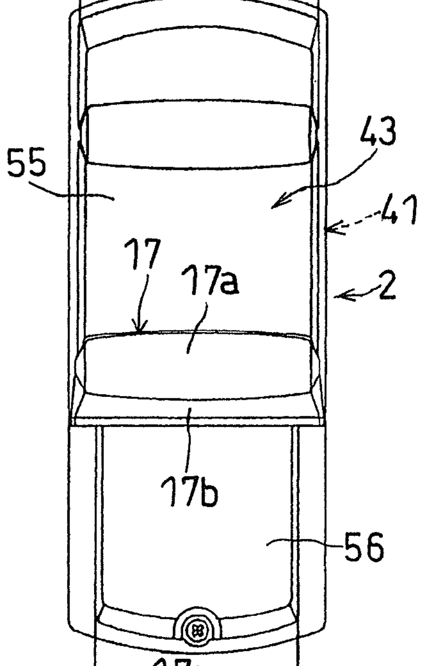
FIG. 5*b* is a front elevational view of the beam receiver.
Figure 5C:
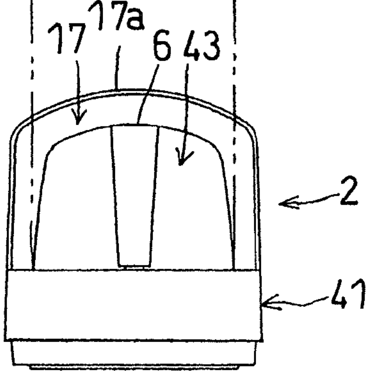
FIG. 5*c* is a bottom plan view of the beam receiver.
Figure 5D:
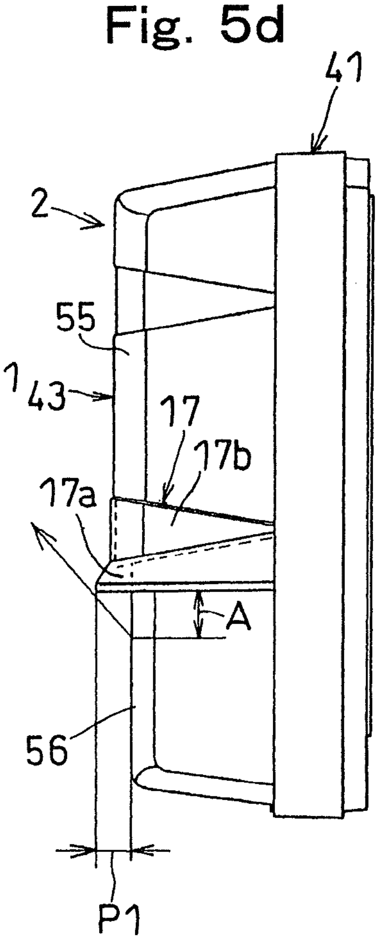
FIG. 5*d* is a right side view of the beam receiver.
Figure 5E:
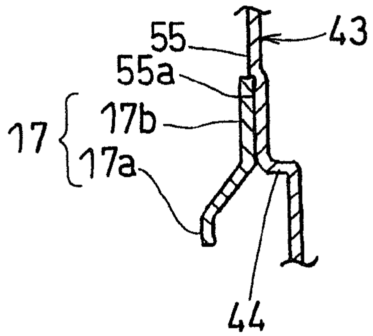
FIG. 5*e* is a longitudinal sectional view of an essential portion of the beam receiver.

FIGS. 5*a* to 5*e* illustrate a top plan view, a front elevational view, a bottom plan view, a right side view and a fragmentary longitudinal sectional view of the beam receiver 2. In those figures, the non-recessed portion 55 located above that portion of the cover 43, where the hood 17 is fitted, is so shaped as to accommodate the maximum pivotal path diameter D1 depicted by the upper end contour of the unit casing 45. As hereinbefore described, since the maximum pivotal path diameter D1 merely increases to a value slightly greater than the diameter depicted by the path of pivotal movement in the conventional sensor device, the non-recessed portion 55 can be set to have the contour of a size that is substantially equal to that of the cover used in the conventional sensor device. Accordingly, the hood 17 that is secured to the outer surface of the non-recessed portion 55 of the cover 43 can be of the substantially same size as the existing hood. Thus, the security sensor device of the present invention will not result in an increase of the overall size thereof as compared with the conventional sensor device. The hood 17 has a fitting area 17*b* and a visor portion 17*a* protruding outwardly from the cover 43 and, as best shown in FIG. 5*e*, the fitting area 17*b* is engaged in a mounting area 55*a*, which is defined in the outer surface of the non-recessed portion 55 in the cover 43 so as to be depressed somewhat inwardly, and is then fixed in position by the use of, for example, a bonding agent.

On the other hand, the recessed portion 56 below that portion of the cover 43, where the hood 17 is secured, has an external form reduced in size by a quantity corresponding to the difference between the minimum pivotal path diameter D2, depicted by the lower end contour of the unit casing 45 shown in FIG. 2*b*, and the diameter of pivotal movement in the conventional sensor device. For this reason, the stepped portion 44 in the cover 43 as best shown in FIG. 2*a* is of a size matching with the difference in size between the non-recessed portion 55 and the recessed portion 56. As a result thereof, the amount of protrusion P1 of the visor portion 17*a* in a direction outwardly from the beam transmissive surface of the cover 43 is increased a value corresponding to the size of the stepped portion 44 if the hood 17 of the substantially same shape as that in the conventional sensor device is employed. Hence, the effective frost protective area, which is defined by a shadow of the visor portion 17*a* in the beam transmissive surface of the cover 43 against the airy region, can have a vertical width A that is so large as to increase the frost protective effect. Accordingly, not only can the security sensor device of the present invention be so structured as to have an overall external form that is not increased as hereinabove described, but deposit of the frost on a portion of the beam transmissive surface of the cover 43 can be avoided to thereby suppress an undesirable reduction of the amount of the infrared beam IR passing across the cover towards the lower optical element 22, which is one of the upper and lower optical elements 22, 22.

FIG. 6 illustrates a modified form of the first embodiment of the present invention and component parts shown therein, but similar to those shown in FIG. 5 are designated by like reference numerals. In the example shown therein, in addition to the provision of the hood 17 which is in the first embodiment used to shield an upper region of the beam transmissive surface of the cover 43 for the passage of the infrared beam IR for the lower optical element 22 from the airy region, an additional hood 17A is employed for shielding an upper region of the beam transmissive surface of the cover 43 for the passage of the infrared beam IR for the upper optical element 22 from the airy region. For this additional hood 17A, a hood of the same size as that of the lower hood 17 is employed.

According to the above construction, since the amount of protrusion P2 of the additional hood 17A outwardly from the cover 43 remains the same as that in the conventional sensor device, the vertical width A2 of the effective frost protective area, which is defined in the beam transmissive surface of the cover 43 for the passage of the infrared beam IR for the upper optical element 22, similarly remains the same as that in the conventional sensor device. However, the use of the additional hood 17A is effective to suppress any possible reduction in amount of the infrared beam IR across the cover relative to the upper beam receiving element 23 and, therefore, a failure to detect can be further complemented.

Figures 7A, 7B, 7C:
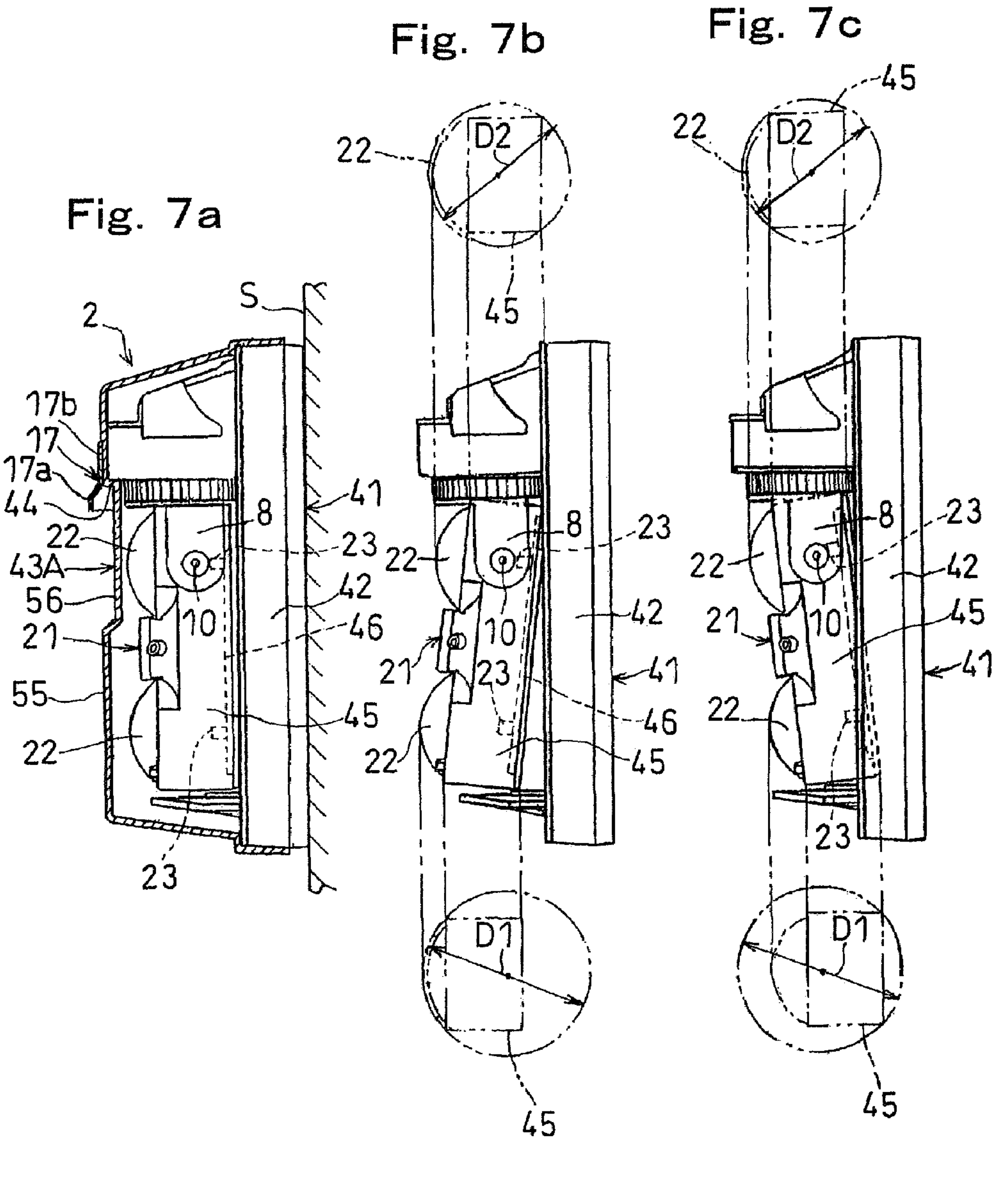
FIG. 7*a* is a right side view showing the beam receiver of the security sensor device according to a second preferred embodiment of the present invention, with a portion thereof cut out.
FIGS. 7*b* and 7*c* are right side views of the element unit held at different angles of vertical deflection relative to the sensor body, respectively.

FIG. 7 illustrates a second preferred embodiment of the present invention and FIGS. 7*a* to 7*c* correspond respectively to FIGS. 2*a* to 2*c* and, accordingly, component parts shown therein, but similar to those shown in FIGS. 2*a* to 2*c* are designated by like reference numerals. While in the first embodiment the transverse pivot pins 10 that defines the center of pivotal movement for the vertical deflecting angle $\theta v$ have been eccentrically positioned or displaced downwardly relative to the intermediate portion of the element unit 21, the transverse pivot pins 10 that defines the center of pivotal movement for the vertical deflecting angle $\theta v$ in this second embodiment are eccentrically positioned or displaced the same distance as in the first embodiment in a direction upwardly relative to the intermediate portion of the element unit 21. Thus, a portion of the beam transmissive surface of a cover 43A corresponding to the upper optical element 22 can be shielded by the hood 17 from the airy region. Accordingly, the cover 43A is of such a shape as to have the recessed portion 56 provided in a portion thereof intermediate of the vertical direction in alignment with the upper optical element 22 and also as to have the non-recessed portion 55 provided on respective sides upwardly and downwardly of the recessed portion 56.

The security sensor device according to this second embodiment differs from that according to the first embodiment only in respect of the manner of support of the element unit 21 and the shape of the cover 43A and, therefore, effects similar to those afforded by the first embodiment can be obtained. In other words, the first embodiment merely differs from the second embodiment in that while in the first embodiment deposition of the frost on that portion of the cover 43 corresponding to the lower optical element 22 is prevented, in the second embodiment deposition of the frost on that portion of the cover 43A corresponding to the upper optical element 22 is prevented. Hence, the non-recessed portion 55 can have the external form, which is of the substantially same size as that of the cover used in the conventional sensor device and, at the same time, a hood of the same size as the existing hood can be employed. Accordingly, without incurring an increase of the overall size, the frost protective effect similar to that afforded by the first embodiment can be obtained by the utilization of the stepped portion 44 of the same size as that in the first embodiment.

The present invention can be equally applied to the beam transmitter 1 shown in FIG. 1, other than to the beam receiver 2 of the security sensor device, which has been illustrated and described in connection with the foregoing embodiments, and also to a passive type infrared detector for detecting far infrared beams and a security sensor device utilizing a conjugated detecting technology, in which the active type and the passive type are combined.

Although the present invention has been fully described in connection with the preferred embodiments thereof with reference to the accompanying drawings which are used only for the purpose of illustration, those skilled in the art will readily conceive numerous changes and modifications within the framework of obviousness upon the reading of the specification herein presented of the present invention. Accordingly, such changes and modifications are, unless they depart from the scope of the present invention as delivered from the claims annexed hereto, to be construed as included therein.

What is claimed is:

1. A security sensor device which comprises:
- a sensor body;
- an element unit including a sensor element for transmitting or receiving a detection wave, the element unit being supported by the sensor body for adjustment of a horizontal deflecting angle and a vertical deflecting angle;
- a cover mounted on the sensor body for covering the element unit;
- a center of pivotal movement for vertical deflection in the element unit being set to an eccentric position downwardly or upwardly displaced from a portion of the element unit intermediate in a vertical direction thereof;
- a stepped portion;
- a recessed portion, which is recessed inwardly of the cover beyond a neighboring portion, being formed through the stepped portion in a portion of the cover on one side to which the center of pivotal movement of the element unit is displaced; and
- a hood provided at a location upwardly of the center of pivotal movement in the cover for shielding at least a portion of an area of passage of a detection wave for the sensor element from an airy region.

2. The security sensor device as claimed in claim 1, further comprising a non-recessed portion of the cover defined above the stepped portion, wherein the hood is supported by the non-recessed portion.

3. The security sensor device as claimed in claim 1, wherein the detection wave is an infrared beam, wherein the element unit includes upper and lower optical elements for transmitting or receiving the infrared beam and wherein the hood is operable to accomplish the shielding to one of the optical elements positioned on one side to which the center of pivotal movement is displaced.

4. The security sensor device as claimed in claim 3, further comprising an additional hood provided in the cover for accomplishing the shielding to the other of the optical elements.

* * * * *